United States Patent [19]

Glenn

[11] Patent Number: 4,462,041

[45] Date of Patent: Jul. 24, 1984

[54] HIGH SPEED AND CURRENT GAIN INSULATED GATE FIELD EFFECT TRANSISTORS

[75] Inventor: R. Douglas Glenn, Palm Bay, Fla.

[73] Assignee: Harris Corporation, Melbourne, Fla.

[21] Appl. No.: 246,077

[22] Filed: Mar. 20, 1981

[51] Int. Cl.³ .......................................... H01L 29/78
[52] U.S. Cl. ...................................... 357/23; 357/41; 357/46
[58] Field of Search ............... 357/23 MG, 23 R, 41, 357/45, 46, 59, 36

[56] References Cited

U.S. PATENT DOCUMENTS

| | | | |
|---|---|---|---|
| 3,390,025 | 6/1968 | Strieter | 357/36 |
| 3,398,335 | 8/1968 | Dill | 357/36 |
| 3,484,865 | 12/1969 | Nienhuis | 357/23 |
| 3,586,930 | 6/1971 | Das et al. | 357/23 |
| 3,652,906 | 3/1972 | Christensen | 357/23 |
| 3,667,115 | 6/1972 | Barson et al. | 357/23 |
| 3,694,673 | 9/1972 | Au | 357/23 |
| 3,813,586 | 5/1974 | Conner | 357/23 |
| 4,015,278 | 3/1977 | Fukuta | 357/22 |
| 4,084,173 | 4/1978 | Fantechi | 372/46 |
| 4,219,828 | 8/1980 | Lardy et al. | 357/23 |

Primary Examiner—James W. Davie
Attorney, Agent, or Firm—Barnes & Thornburg

[57] ABSTRACT

An improved insulated gate field effect transistor having a plurality of alternately positioned source and drain regions interconnected by interdigitized drain and source finger conductors making contact at a plurality of positions to a respective source or drain region. A serpentine gate conductor makes contacts to both areas of the plurality of polycrystalline gates between the plurality of source and drain regions.

25 Claims, 3 Drawing Figures

HIGH SPEED AND CURRENT GAIN INSULATED GATE FIELD EFFECT TRANSISTORS

BACKGROUND OF THE INVENTION

The present invention relates to insulated gate field effect transistors and more specifically to an improved high speed, high current gain insulated gate field effect transistor.

To increase the current gain of an insulated gate field effect transistor, it is well known to increase the channel width to length (W/L) ratio. A typical example is illustrated in U.S. Pat. No. 3,586,930 to Das et al. wherein diffused source and drain regions extend interdigitated toward each other from opposing diffused base regions. Contacts are made to the diffused base regions. The metal gate includes U-shaped loops connected to a base portion. Thus in effect, a single field effect transistor is made up of a plurality of field effect transistors connected in parallel. By using diffused source and drain fingers extending from a base, the metal to metal spacing restriction of the source and drain electrodes which hinders large width to length ratios, is eliminated. It should be noted that this structure increases switching delay time since the resistance of the source and drain structures is increased since the current must travel from the base portion through many squares of diffusion to the individual fingers.

Another example to alleviate the metal to metal spacing limitation is illustrated in U.S. Pat. No. 3,484,865 to Nienhuis wherein the contact to either the source or drain region is made on the opposite planar surface than the gate and the other source or drain connections. A very complicated structure having interdigitated source and gate electrodes with a crossing drain electrode is illustrated in U.S. Pat. No. 4,015,278 to Fukuta.

Although the prior art has increased the width to length ratio of the channel by using a plurality of source and drain regions connected in parallel, the resulting increased resistance of these regions because of the contact and interconnect schemes severely reduces the speed of the device. Thus there exists a need for a high speed, high current gain insulated gate field effect transistor.

SUMMARY OF THE INVENTION

An object of the present invention is to provide an improved high speed and high current gain insulated gate field effect transistor.

Another object of the present invention is to provide a unique insulated gate field effect transistor structure which minimizes resistance paths while increasing the width to length ratio of the channel.

A still further object of the present invention is to provide an insulated gate field effect transistor of minimum length and internal resistance.

These and other objects of the invention are attained by providing alternating diffused source and drain regions in a body of semiconductor material with a gate material therebetween. Source and drain conductor fingers extend interdigitized from opposed base conductors and contact the respective source or drain region in a plurality of areas. The gate conductor traverses the area between the source and drain conductor fingers in a serpentine pattern making contact with both ends of the individual gates. The resulting structure minimizes internal resistance and capacitance and maximizes the width to length ratio of the channel.

Other objects, advantages and novel features of the present invention will become apparent upon review of the following description in conjunction with the accompanying drawings.

DESCRIPTION OF THE PREFERRED EMBODIMENTS

An insulated gate field effect transistor according to the principles of the present invention maximizes the current gain by maximizing the width to length ratio of the channel. This results from forming a plurality of insulated gate field effect transistors of very small lengths connected in parallel to produce a field effect transistor with small channel lengths and long channel widths as defined by the sum of the widths of the insulated gate field effect transistors. The structure of the insulated gate field effect transistor is also selected to minimize propagation delays by minimizing the losses due to parasitic series gate resistances and overlapping gate capacitances.

Figure 1:
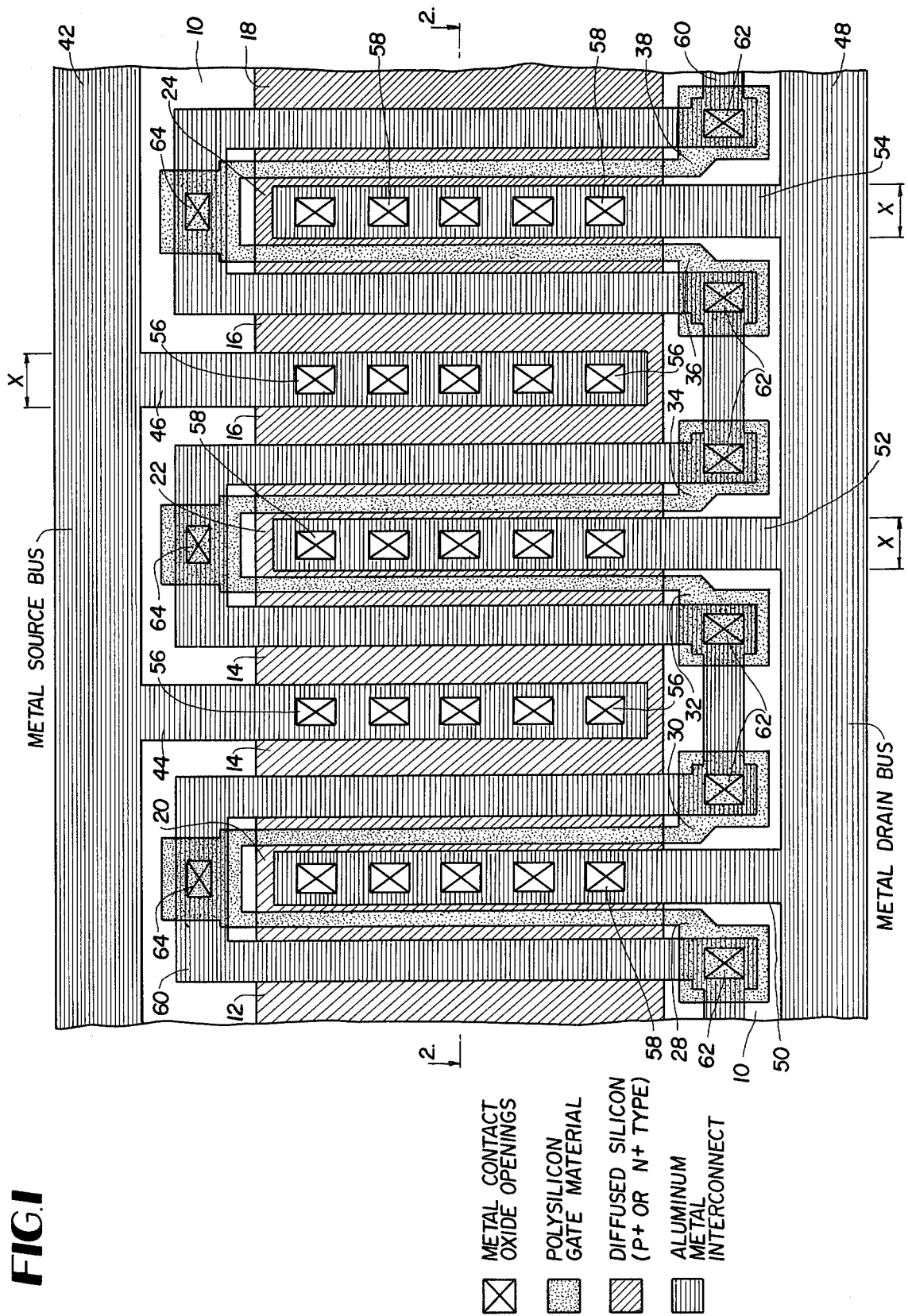
FIG. 1 is a plane view of an insulated gate field effect transistor incorporating the principles of the present invention.
Figure 2:
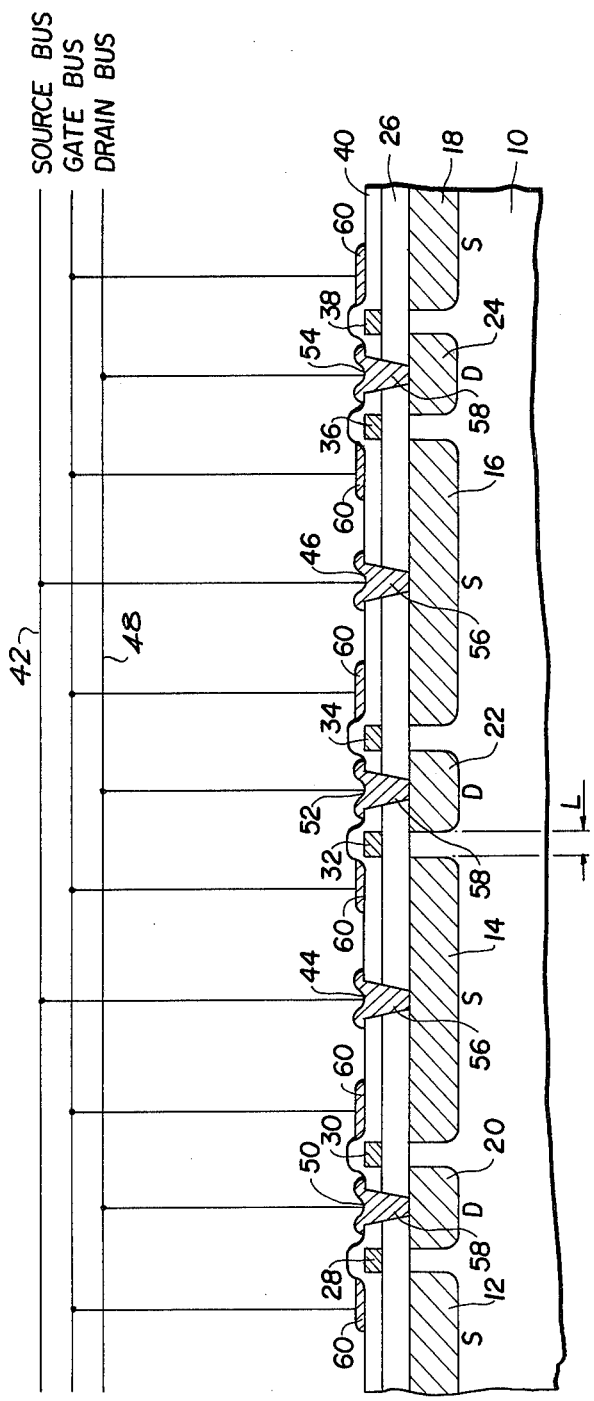
FIG. 2 is a cross-sectional view taken along lines 2—2 of FIG. 1.

An insulated gate field effect transistor structure according to the principles of the present invention is illustrated in FIGS. 1 and 2 and includes a body portion 10 of a first conductivity type having a plurality of source regions 12, 14, 16 and 18 spaced apart and separated by a plurality of drain regions 20, 22 and 24, all of opposite conductivity type to the body portion 10. As is well known, the body portion 10 may be a substrate, an epitaxial layer formed on a substrate or any other body. The source and drain regions may be formed by deposition or ion implantation followed by diffusion. As is evident from FIG. 1, the source and drain regions are substantially rectangular having substantially equal length and being spaced widthwise. As is evident from FIG. 2, the sources are substantially wider than the drains. It is important that the drain diffusions be kept to a minimum in order to minimize the junction load capacitance.

The surface of the body 10 and the source and drain regions are covered by an insulative layer 26 which forms among other things the insulative layer for the insulated gate field effect transistor. Formed over the body region which separates the source and drain regions are a plurality of gates 28, 30, 32, 34, 36 and 38. Preferably these gates are formed of polycrystalline silicon material doped to an appropriate resistivity. By using a polycrystalline gate instead of a metallic gate material, for example, aluminum which may also be used, the minimum channel length L which is defined by the separation of the source and drain will result. With metallic gate material, there is a limitation in the width of the gate which may be formed and thicker gate oxide must be used. Similarly by using the polycrystalline gate material, the gate need not overlap the source or drain regions as in some metallic gate structures and thereby reduces parasitic capacitances. A second insulative layer 40 covers the first insulative layer 26 and the gate material.

A source conductor includes a bus or base portion 42 having a plurality of finger portions 44 and 46 extending therefrom and across a source region 14 and 16, respectively. Similarly, the drain conductor includes a bus or base portion 48 having a plurality of finger portions 50, 52 and 54 extending across drain regions 20, 22 and 24, respectively. As is evident from FIG. 1, the source finger portions 44 and 46 are interdigitated with the drain finger portions 50, 52 and 54. The source conductor finger portions 44 and 46 make contact at a plurality of positions 56 with each source region through vias in oxide insulative layers 40 and 26. Similarly the drain conductor finger portions 50, 52 and 54 make a plurality of contacts 58 with the respective drain regions through vias in insulative layers 26 and 40.

Figure 3:
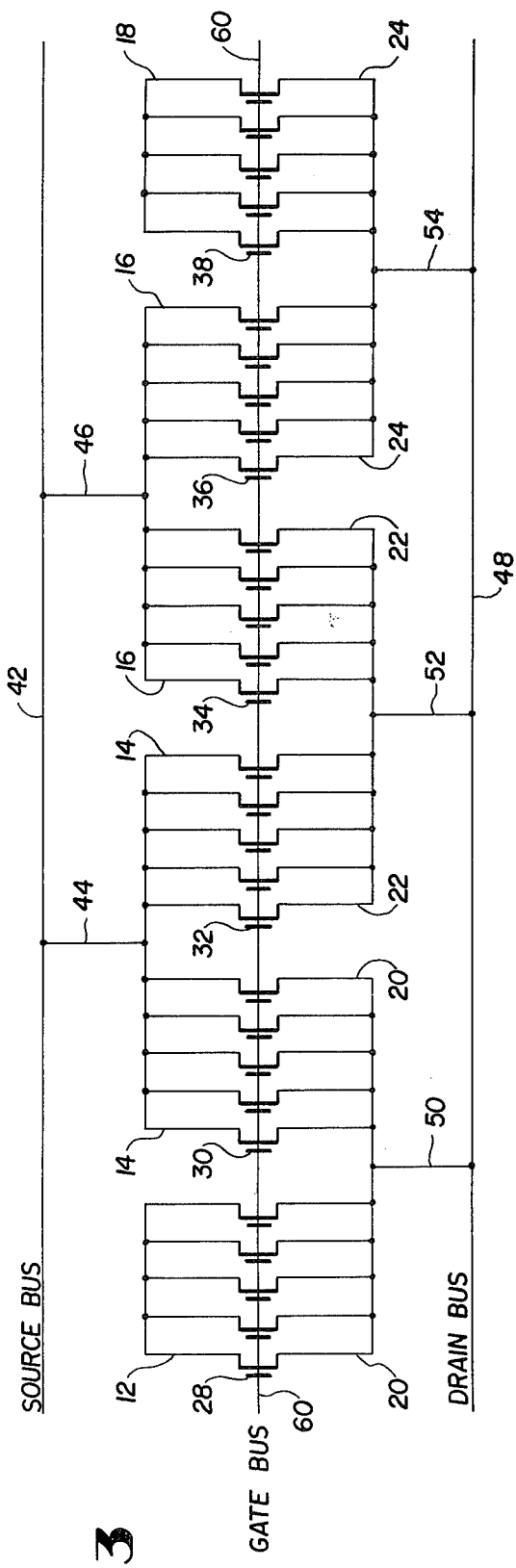
FIG. 3 is a schematic of a field effect transistor illustrated in FIGS. 1 and 2.

As can be seen from the schematic of FIG. 3, not only are a plurality of parallel insulated gate field effect transistors produced by the interdigitation of conductor fingers 44, 46, 50, 51 and 54, but a further subgrouping of parallel insulated gate field effect transistors is produced by the separate connection of the fingers in a plurality of places to a respective diffused source or drain region. For the five connections of each finger portion to its respective source or drain region, a subgroup of five parallel insulated gate field effect transistors results. It should be noted that this method of construction, wherein the source and drain regions are separate and distinct regions and the parallel connection is produced by the metal connection to the diffused regions instead of the diffused regions extending from a common base region as in the prior art, reduces the series resistance of the source and drain regions.

A gate conductor 60 extends over the insulative layer 40 in a serpentine pattern around and about the interdigitized source and drain conductor finger portions. The gate conductor 60 overlaps only either the source regions or the body portion thereby minimizing the gate to drain capacitance. The gate conductor 60 is connected to one end 62 of each of the gate materials 28, 30, 32, 34, 36 and 38 at a region over the body portion 10 exterior the source and drain regions as well as at a second end 64 common to a respective pair of gate regions 28-30, 32-34, and 36-38 and also at a region over the body 10 exterior the source and drain regions. By connecting the gate conductor 60 to both ends of the gates, the intrinsic series resistance of the polycrystalline gate material is reduced. Similarly by making the connections of the gate conductor to the gate material at the regions exterior the source and drain regions, the gate material can be enlarged by the minimum amount permissible to accommodate the contact apertures without affecting the minimum channel length. Since the insulating oxide layers are thicker in the region exterior the channel, the enlarged gate material will be minimally parasitic with a small amount of added gate-to-body capacitance.

Although not shown, the serpentine gate conductor 60 extends from a base portion to which the external circuit may be connected. As is evident in FIG. 1, the interconnection of the individual gates is by the gate conductor 60. By minimizing the amount of polycrystalline material used in the connection, the parasitic losses from the connection of parallel gate portions is minimized.

As is evident from FIGS. 1, 2 and 3, the source and drain regions are shared. For example, the source region 14 forms the source for ten insulated gate field effect transistors connected in parallel, five of which have common drains 20 and five of which have common drains 22 with the common source 14. The five insulated gate field effect transistors connected in parallel having common source region 14 and having common drain region 20 have a common gate 30 while the five insulated gate field effect transistors connected in parallel having common drain region 22 have a common gate 32.

The selection of the width of the bus portions 42 and 48 must be selected to carry the peak drain to source current. Similarly, the minimum source diffusion width is defined by the combination of the minimum metal-to-metal spacing plus the minimum metal line width as defined by the limitations of the process used. Once this minimum metal line width is defined, the number of sublets or connections of each finger to a respective source or drain is defined such that the total peak drain to source current divided by the total number of connections to all of the drain regions is within the current handling capability for the minimum width metal line. For the example illustrated in FIGS. 1–3, the total peak drain to source current is shared by three common drain fingers which feed the thirty effective parallel transistors. Each metal drain finger must only need to handle ⅓ of the total peak drain to source current. Similarly it should be noted that the gate conductor 60 need only be wide enough to handle the peak gate current which is relatively small compared to the peak drain to source currents.

It is evident from the detailed description of the preferred embodiments, that the objects of the invention are attained in that an improved insulated gate field effect transistor structure is provided which is capable of high speed operation and has high current gain. Although the invention has been described and illustrated in detail, it is clearly understood that the same is by way of example and illustration only and is not to be taken by way of limitation. The terms of the present invention are to be limited only by the terms of the appended claims.

What is claimed:

1. A high speed, high current gain insulated gate field effect transistor comprising:
    a body region of semiconductor material having a first conductivity type;
    a continuous source region and a continuous drain region each having a second conductivity type opposite said first conductivity type spaced apart in the surface of said body region defining a channel region therebetween;
    a gate over said channel region between said source and drain regions and separated from said body by an insulative layer;
    a source conductor in contact with said source region at a plurality of distinct positions adjacent said channel region;
    a drain conductor in contact with said drain region at a plurality of distinct positions across said channel from corresponding source distinct positions;
    said source conductor and said drain conductor form a plurality of electrically parallel insulated gate transistors having a common source region, common drain region and common gate.

2. The insulated gate field effect transistor according to claim 1 including gate conductor means in contact with both ends of said gate for reducing the series resistance of said gate.

3. The insulated gate field effect transistor according to claim 1 wherein said drain region has a substantially smaller surface area than said source region.

4. The insulated gate field effect transistor according to claim 1 wherein said source region and said drain region are rectangular regions having a substantially greater length than width, the regions are spaced widthwise, and have equal length.

5. The insulated gate field effect transistor according to claim 1 wherein said gate is a polycrystalline semiconductor material.

6. The insulated gate field effect transistor according to claim 1 wherein said gate is a metallic material.

7. An insulated gate field effect transistor comprising:
a body of semiconductor materials of a first conductivity type;
a pair of spaced drain regions of a second conductivity type opposite said first conductivity type in the surface of said body;
a source region of said second conductivity type in the surface of said body between and spaced from said drain regions;
a pair of gates each over the body region between said source region and a respective drain region and separated from said body by an insulative layer;
a drain conductor having a base portion and a pair of parallel fingers extending from said base portion, each finger being over a respective drain region and making contact therewith;
a source conductor having a base portion and a finger portion extending from said base portion parallel to said drain finger portions, said source finger portion being over said source region and making contact therewith;
said drain and source finger portions being interdigitated;
a gate conductor extending about and around said source and drain finger portions without traversing said source and drain conductors;
said gate conductor contacting both ends of each of said pair of gates to reduce the series resistance of said gates.

8. The insulated gate field effect transistor according to claim 7 wherein said source conductor finger contacts said source region in a plurality of positions and each of said drain conductor fingers contacts their respective drain region in a plurality of positions corresponding to the plurality of source contact positions to form a plurality of electrically parallel connected insulated gate field effect transistors.

9. The insulated gate field effect transistor according to claim 7 wherein said source and drain regions are generally rectangular, have substantially the same length and being spaced widthwise, and said source region has a substantially greater width than said drain regions.

10. The insulated gate field effect transistor according to claim 7 wherein said gate conductor traverses said source region and said body exterior said source and drain regions without traversing said drain regions.

11. The insulated gate field effect transistor according to claim 7 wherein said pair of gates are interconnected by said gate conductor and said gates are polycrystalline semiconductor material.

12. The insulated gate field effect transistor according to claim 7 wherein said pair of gates are interconnected by said gate conductor and said gates are metallic material.

13. An insulated gate field effect transistor comprising:
a body of semiconductor materials of a first conductivity type;
a pair of spaced source regions of a second conductivity type opposite said first conductivity type in the surface of said body;
a drain region of said second conductivity type in the surface of said body between and spaced from said source regions;
a pair of gates each over the body region between said drain region and a respective source region and separated from said body by an insulative layer;
a source conductor having a base portion and a pair of parallel fingers extending from said base portion, each finger being over a respective source region and making contact therewith;
a drain conductor having a base portion and a finger portion extending from said base portion parallel to said source finger portions, said drain finger portion being over said drain region and making contact therewith;
said drain and source finger portions being interdigitated;
a gate conductor extending about and around said source and drain finger portions without traversing said source and drain conductors;
said gate conductor contacting both ends of each of said pair of gates to reduce the series resistance of said gates.

14. The insulated gate field effect transistor according to claim 13 wherein said drain conductor finger contacts each drain region in a plurality of positions and each of said source conductor fingers contacts their respective source region in a plurality of positions corresponding to the plurality of drain contact positions to form a plurality of electrically parallel connected insulated gate field effect transistors.

15. The insulated gate field effect transistor according to claim 13 wherein said source and drain regions are generally rectangular, have substantially the same length and being spaced widthwise, and said source regions have a substantially greater width than said drain region.

16. The insulated gate field effect transistor according to claim 13 wherein said gate conductor traverses said source regions and said body exterior said source and drain regions without traversing said drain region.

17. The insulated gate field effect transistor according to claim 13 wherein said pair of gates are interconnected by said gate conductor and said gates are polycrystalline semiconductor material.

18. The insulated gate field effect transistor according to claim 13 wherein said pair of gates are interconnected by said gate conductor and said gates are metallic material.

19. An insulated gate field effect transistor comprising:
a body of semiconductor material of a first conductivity type;
a plurality of source regions of a second conductivity type opposite said first conductivity type spaced in said body;

a plurality of drain regions of said second conductivity type in said body spaced from and interdigitated with said source regions;

a plurality of gates over the body regions between said source and drain regions and separated from said body by a layer of insulation;

a plurality of source conductor fingers each over and making contact with a corresponding source region and extending from a source conductor base to connect said source regions in parallel electrically;

a plurality of drain conductor fingers each over and making contact with a corresponding drain region, interdigitated with said source fingers and extending from a drain conductor base to connect said drain regions in parallel electrically; and a gate conductor traversing the area between said source and drain conductor fingers in a serpentine pattern and making contact with each gate to contact the gates in series electrically.

20. The insulated gate field effect transistor according to claim 19 wherein said source conductor fingers contact their respective source region in a plurality of positions and each of said drain conductor fingers contact their respective drain region in a plurality of positions corresponding to the plurality of source contact positions to form a plurality of electrically parallel connected insulated gate field effect transistors.

21. The insulated gate field effect transistor according to claim 19 wherein said source and drain regions are generally rectangular, have substantially the same length and being spaced widthwise, and said source regions have a substantially greater width than said drain regions.

22. The insulated gate field effect transistor according to claim 19 wherein said gate conductor traverses said source regions and said body exterior said source and drain regions without traversing said drain regions.

23. The insulated gate field effect transistor according to claim 22 wherein said gates include end portions extending beyond said source and drain regions to over said body, said gate conductor contacts both end portions of each gate.

24. The insulated gate field effect transistor according to claim 19 wherein said gate is polycrystalline semiconductor material.

25. The insulated gate field effect transistor according to claim 19 wherein said gate is metallic material.

* * * * *